US008791712B2

(12) United States Patent
Ellis-Monaghan et al.

(10) Patent No.: US 8,791,712 B2
(45) Date of Patent: Jul. 29, 2014

(54) 3-DIMENSIONAL INTEGRATED CIRCUIT TESTING USING MEMS SWITCHES WITH TUNGSTEN CONE CONTACTS

(75) Inventors: John J. Ellis-Monaghan, Grand Isle, VT (US); Jeffrey P. Gambino, Westford, VT (US); Kirk D. Peterson, Jericho, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 13/364,345

(22) Filed: Feb. 2, 2012

(65) Prior Publication Data

US 2013/0200910 A1   Aug. 8, 2013

(51) Int. Cl.
*G01R 1/067*   (2006.01)

(52) U.S. Cl.
USPC .................................................. 324/755.01

(58) Field of Classification Search
CPC ...... G01R 1/067; G01R 3/00; G01R 1/07342; G01R 1/07378; G01R 1/07; G01R 31/2886; H01L 28/20; H01L 21/768
See application file for complete search history.

(56) References Cited

U.S. PATENT DOCUMENTS

| | | | |
|---|---|---|---|
| 5,500,607 A | 3/1996 | Verkuil | |
| 5,650,731 A | 7/1997 | Fung et al. | |
| 6,348,810 B1 | 2/2002 | Yanagawa et al. | |
| 6,715,663 B2 | 4/2004 | Seshan et al. | |
| 6,977,516 B2 * | 12/2005 | Ferreira et al. | 324/750.15 |
| 7,219,418 B2 | 5/2007 | Byrd | |
| 7,579,847 B2 | 8/2009 | Miller | |
| 7,656,174 B2 | 2/2010 | Kasukabe et al. | |
| 8,541,864 B2 * | 9/2013 | Lukaitis et al. | 257/506 |
| 2008/0116927 A1 | 5/2008 | Dozier et al. | |
| 2009/0114913 A1 | 5/2009 | Bernstein et al. | |

OTHER PUBLICATIONS

Lakamraju, et al., "Bi-stable RF MEMS Switch with Low Actuation Voltage," Department of Electrical Engineering, Arizona State University, Tempe, Arizona, 2003, 7 pages.
Saheb et al., "System Integration of High Voltage Electrostatic MEMS Actuators," IEEE 2005, pp. 1-4.
http://www.unisoku.com/products/STMContactMeasurement.html. 1999-2010.
Watanabe, et al., "Low-Temperature High-Density Chip-Stack Interconnection Using Compliant Bump," 2007 Electronic Components and Technology Conference, 2007, pp. 622-626.
Mercado, et al., "A Mechanical Approach to Overcome RF MEMS Switch Stiction Problem," 2003 Electronic Components and Technology Conference, 2003, pp. 377-384.

* cited by examiner

*Primary Examiner* — Tung X Nguyen
(74) *Attorney, Agent, or Firm* — Gibb & Riley, LLC; Michael J. LeStrange, Esq.

(57) ABSTRACT

A test system for testing a multilayer 3-dimensional integrated circuit (IC), where two separate layers of IC circuits are temporarily connected in order to achieve functionality, includes a chip under test with a first portion of the 3-dimensional IC, and a test probe chip with a second portion of the 3-dimensional IC and micro-electrical-mechanical system (MEMS) switches that selectively complete functional circuits between the first portion of the 3-dimensional IC in a first IC layer to circuits within the second portion of the 3-dimensional IC in a second IC layer. The MEMS switches include tungsten (W) cone contacts, which make the selective electrical contacts between circuits of the chip under test and the test probe chip and which are formed using a template of graded borophosphosilicate glass (BPSG).

20 Claims, 5 Drawing Sheets

3-DIMENSIONAL INTEGRATED CIRCUIT TESTING USING MEMS SWITCHES WITH TUNGSTEN CONE CONTACTS

BACKGROUND

1. Field of the Invention

The embodiments generally relate to functional testing of a multilayer 3-dimensional integrated circuit (IC), where two separate layers of IC circuits are temporarily connected in order to achieve functionality. More specifically, the embodiments relate to testing a portion of a 3-dimensional IC that is disposed within a chip under test, which includes a first IC layer, by employing a test probe chip including another portion of the 3-dimensional IC in a second IC layer and micro-electrical-mechanical system (MEMS) switches that selectively complete functional circuits, which span the first and second IC layers. Yet more specifically, the MEMS switches include tungsten (W) cone contacts that are formed using a template of graded borophosphosilicate glass (BPSG).

2. Description of Related Art

Three dimensional integrated circuits (ICs) include a number of advantages: shorter interconnects, which provide less delay and require less power; integration of different IC technologies, e.g., separate gallium arsenide (GaAs) and silicon (Si) semiconductor layers; and a smaller form factor. Integration of different IC technologies in a 3-dimensional IC can also include only an n-type metal oxide semiconductor (n-MOS) for a first layer and only a p-type metal oxide semiconductor (p-MOS) for a second layer. Use of separate n-MOS and p-MOS layers for a 3-dimensional IC greatly simplifies wafer processing compared to conventional complementary metal oxide semiconductor (CMOS) processes, which mix n-MOS and p-MOS technologies within a single layer. However, a 3-dimensional CMOS circuit formed from two separate n-MOS and p-MOS layers is only functional when the two n-MOS and p-MOS layers are joined together, i.e., electrically interconnected. Similarly, other 3-dimensional circuits may also provide functionality only when two layers of different IC technologies are electrically interconnected.

For a 3-dimensional circuit with a large die size, i.e., a die size with a less than 90% yield, it is preferable to bond only a good die of one layer to another good die from an adjoining layer in order to avoid losses associated with joining a good die to a bad die. However, functional testing of a circuit within a single layer of a 3-dimensional circuit is not possible, when the functional circuit spans two layers and only a portion of the functional circuit is disposed within the single layer.

There remains a need to functionally test portions of a 3-dimensional integrated circuit (IC) that is disposed within a single layer, before the single layer is permanently joined to a second layer of the 3-dimensional IC.

SUMMARY

In view of the foregoing, an exemplary embodiment of the invention disclosed herein may provide a test probe chip including an integrated circuit (IC) layer that forms a portion of a 3-dimensional IC, in which the IC layer is formed above a base layer. The test probe chip may also include a first through silicon via (TSV), in which the first TSV contacts the IC layer and may extend through the base layer to contact a micro-electrical-mechanical systems (MEMS) switch. The MEMS switch of the test probe chip may include a beam having an upper surface of a first end that contacts an extension of the first TSV beneath a lower surface of the base layer, a tungsten (W) cone contact may be disposed on a lower surface at a second end of the beam, and an actuator may be disposed on the lower surface of the base layer and may be separated from the upper surface of the second end of the beam by an air gap, when not actuated.

Another exemplary embodiment of the invention disclosed herein may provide a test system including a chip under test, a test probe chip, and external test equipment. The chip under test may include a first integrated circuit (IC) layer that forms a first portion of a 3-dimensional IC, a first base layer disposed above the first IC layer, and a through silicon via (TSV) that contacts the first IC layer and extends above an upper surface of the first base layer, in which the TSV is capped by a metal cap. The test probe chip may include a second IC layer that forms a second portion of the 3-dimensional IC and a second base layer disposed beneath the second IC layer. The second base layer may include a first TSV and a second TSV, in which the first TSV contacts the second IC layer and extends through the base layer to contact a micro-electrical-mechanical systems (MEMS) switch. The MEMS switch may include a beam, in which an upper surface of a first end of the beam contacts the first TSV of the test probe chip. The MEMS switch may also include a tungsten (W) cone contact disposed on a lower surface at a second end of the beam, where the W cone contact is aligned above the metal cap of the TSV that contacts the first IC layer of the chip under test. The MEMS switch may further include an actuator disposed on a lower surface of the test probe chip and above the upper surface at a second end of the beam. The external test equipment may contact the actuator of the MEMS switch through the second TSV of the test probe chip.

BRIEF DESCRIPTION OF THE DRAWINGS

The embodiments herein will be better understood from the following detailed description with reference to the drawings, which are not necessarily drawing to scale and in which.

DETAILED DESCRIPTION

The descriptions of the various embodiments of the embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As stated above, there remains a need to functionally test portions of a 3-dimensional integrated circuit (IC) that are disposed within a single layer, before the single layer is permanently joined to a second layer of the 3-dimensional IC.

Exemplary embodiments may use a test probe chip, including a second IC layer, to test the functionality of portions of a 3-dimensional IC that are disposed within a chip under test, which includes a first IC layer. For example, if a partial functional circuit in the first IC layer is to be tested, the test probe chip is formed using a chip that includes a second IC layer, which when connected to the chip under test completes the functional circuit spanning the two IC layers. The test probe chip may use a second IC layer that is known to be good. Functional testing may include temporary connections between the partial functional circuits to be tested in the first IC layer and those portions of the functional circuits disposed within the second IC layer of the test probe chip to identify a good chip under test. The results of the functional testing, e.g., voltages or timing delays, may be communicated from the test probe chip to test equipment that is external to the test probe chip by methods that are well known in the art. The external test equipment may be programmed with the required test specifications as is also well known in the art.

Figure 1:
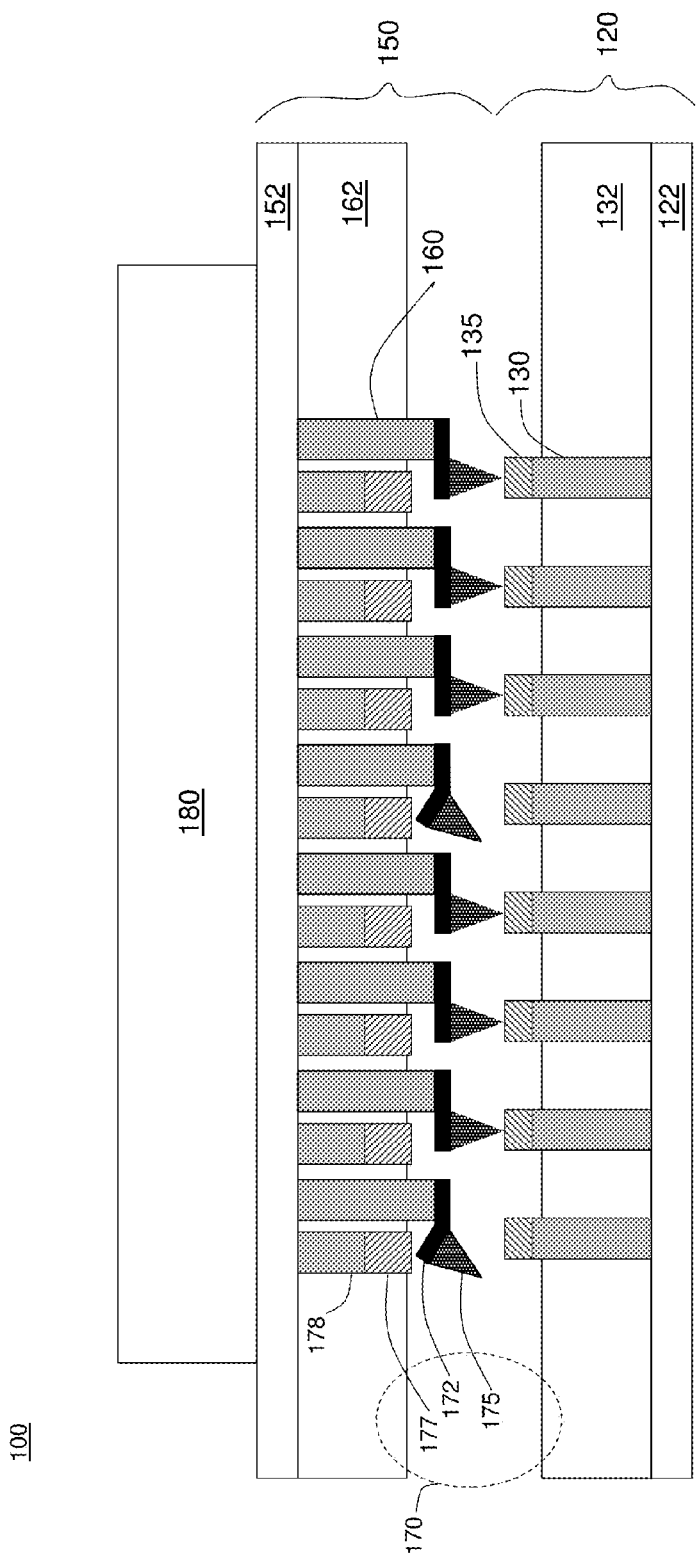
FIG. 1 is a schematic diagram illustrating a test system for testing a 3-dimensional IC using micro-electrical-mechanical system (MEMS) switches in an exemplary embodiment.

Referring to FIG. 1, a test system 100 for testing a 3-dimensional IC may include a chip under test 120, a test probe chip 150, and external test equipment 180 in an exemplary embodiment.

The chip under test 120 may include a first IC layer 122, which contains partial functional circuits of a 3-dimensional IC. Nodes within first IC layer 122 may contact through silicon vias (TSVs) 130 that extend upwardly through a base layer 132 and beyond an upper surface of the base layer 132. The extensions of the TSVs 130 beyond the upper surface of the base layer 132 may be capped by metal caps 135, comprising any of tin (Sn), lead (Pb), silver (Ag), gold (Au), and their alloys, that form a portion of a metallization layer for the chip under test 120. The heights of the metal caps 135 above the upper surface of the base layer 132 may vary within a range, which can be accommodated by switches of the test probe chip 150 as explained below.

The TSVs 130 may comprise a peripheral insulating layer, e.g., silicon dioxide (SiO$_2$), and a metallic conductive core comprising any of copper (Cu) and tungsten (W) associated with a barrier layer comprising any of tantalum (Ta), tantalum nitride (TaN), titanium (Ti), and titanium nitride (TiN). The base layer 132 may comprise any of an insulator, a semiconductor, and a combination of an insulator and a semiconductor, and the lower surface of the base layer 132 may comprise any of silicon dioxide (SiO$_2$) and organosilicate glass (SiCOH) with an associated barrier layer, e.g., any of silicon nitride (SiN) and silicon carbon nitride (SiCN).

The test probe chip 150 may include a second IC layer 152, which also contains partial functional circuits of the 3-dimensional IC. Nodes within the second IC layer 152 may contact a first set of TSVs 160 that extend downwardly through a base layer 162 and beyond a lower surface of the base layer 162. The extensions of each of the TSVs 160 beyond the lower surface of the base layer 162 may contact an upper surface of a first end of a beam 172 of a single micro-electrical-mechanical system (MEMS) switch 170. A tungsten (W) cone 175 may be disposed on a lower surface at a second end of the beam 172. Each of the MEMS switches 170 includes an actuator 177 that is disposed on the lower surface of the base layer 162 and above the second end of the beam 172. Each of the actuators 177 for each of the MEMS switches 170 may contact nodes within the second IC layer 152 by a second set of TSVs 178.

Each of the TSVs in the first and second sets of TSVs 160, 178, respectively, may comprise a peripheral insulating layer, e.g., SiO$_2$, and a metallic conductive core comprising any of copper (Cu) and tungsten (W) associated with a barrier layer comprising any of tantalum (Ta), tantalum nitride (TaN), titanium (Ti), and titanium nitride (TiN). The base layer 162 may comprise any of an insulator, a semiconductor, and a combination of an insulator and a semiconductor, and the lower surface of the base layer 162 may any of comprise SiO$_2$ and organosilicate glass (SiCOH) with an associated barrier layer, e.g., any of silicon nitride (SiN) and silicon carbon nitride (SiCN).

Figure 2:
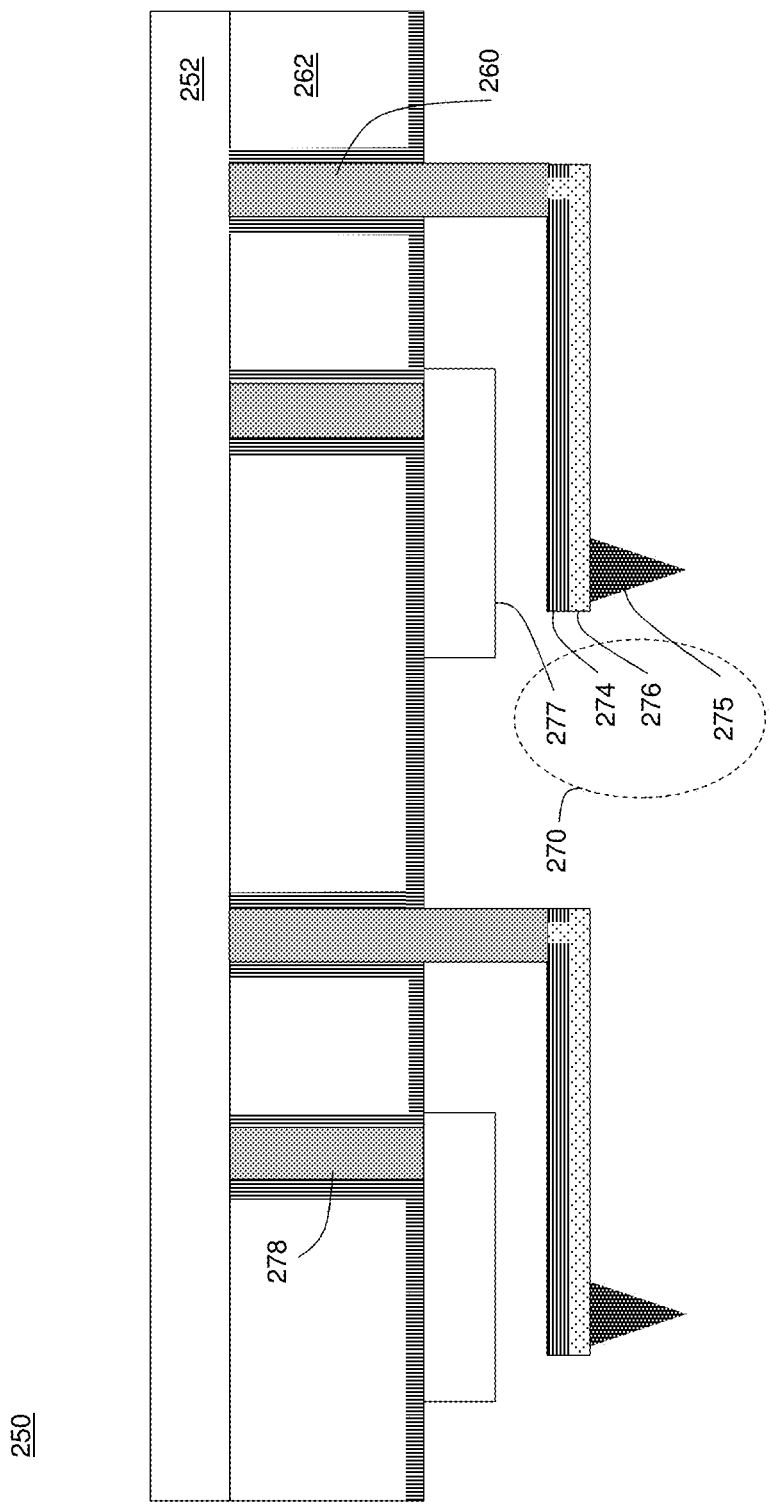
FIG. 2 is a schematic diagram illustrating a test probe chip using MEMS switches with a bilayer beam in an exemplary embodiment.
Figure 3:
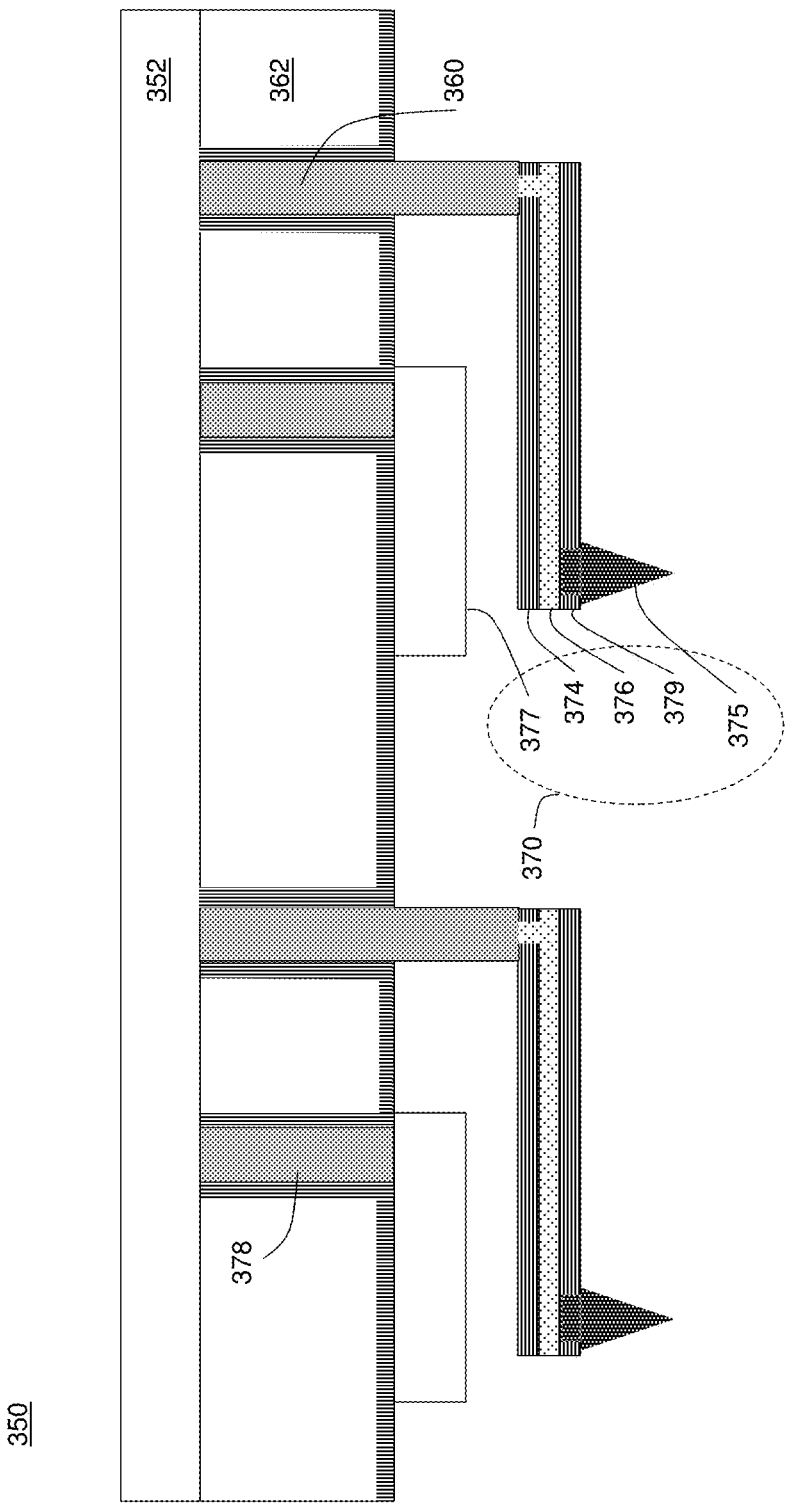
FIG. 3 is a schematic diagram illustrating a test probe chip using MEMS switches with a sandwich beam in an exemplary embodiment.

The beam 172 of each of the MEMS switches 170 may comprise one of a bilayer beam and a sandwich beam, as shown in FIGS. 2 and 3, respectively.

The external test equipment 180 is external to and connected to the test probe chip 150 by various means well known in the art. The external test equipment 180 may be programmed with the required test specifications for the functionality of the 3-dimensional IC, which spans the first IC layer 122 of the chip under test 120 and the second IC layer 152 of the test probe chip 150. During test, the external test equipment 180 may affect contact between any of the actuators 177 of each of the MEMS switches 170 through the second set of TSVs 178 in the test probe chip 150 to implement various functional tests.

As shown in FIG. 1, the external test equipment 180 may selectively actuate a subset of the MEMS switches 170 with an actuation voltage that forms an electrical contact between a W cone 175 and a single metal cap 135 of the TSV 130 that contacts the first IC layer 122. In various embodiments, an actuation voltage may have a higher range of values the result in a non-conducting air gap between the W cone 175 and the single metal cap 135, and a lower range of values that result in electrical contact between the W cone 175 and the single metal cap 135. Variations in the actuation voltage may allow good electrical contact between W cones 175 and single metal caps 135, where the height of the single metal caps from the upper surface of the base layer 132 varies. Variations in the actuation voltage may also be used to "scrub" the underlying metal cap 135 of any overlying oxide by increasing and decreasing the distance between a W cone 175 from the underlying metal cap 135 in order to form a good electrical contact.

As described in detail, below, the W cones 175 may be formed using a template of graded borophosphosilicate glass (BPSG) that is etched with dilute hydrofluoric (HF) acid. The template may then be filled by selective chemical vapor deposition of tungsten (W) to form the W cones 175.

Referring to FIG. 2, test probe chip 250 may include MEMS switches 270 that use a bilayer beam comprising an upper insulating layer 274 and a lower metal layer 276. The test probe chip 250 may include a second IC layer 252, which contains partial functional circuits of a 3-dimensional IC. Nodes within the second IC layer 252 may contact a first set of TSVs 260 that extend downwardly through a base layer 262 and beyond a lower surface of the base layer 262. The extensions of each of the TSVs 260, beyond the lower surface of the base layer 262, may contact a portion of the lower metal layer 276 that penetrates the upper insulating layer 274 at a first end of the bilayer beam to provide electrical contact. The W cone 275 may be disposed on a lower surface of the lower metal layer 276 at a second end of the bilayer beam. Each of the MEMS switches 270 may include an actuator 277 that is disposed on the lower surface of the base layer 262 and above the second end of the bilayer beam. Each of the actuators 277 for each of the MEMS switches 270 may contact nodes within the second IC layer 252 by a second set of TSVs 278.

Each of the TSVs in the first and second sets of TSVs 260, 278, respectively, may comprise a peripheral insulating layer, e.g., silicon dioxide ($SiO_2$), and a metallic conductive core. The base layer 262 may comprise any of an insulator, a semiconductor, and a combination of an insulator and a semiconductor, and the lower surface of the base layer 262 may comprise any of $SiO_2$ and SiCOH with an associated barrier layer of any of SiN and SiCN.

The upper insulating layer 274 of the bilayer beam may comprise one of $SiO_2$, silicon nitride (SiN), and silicon oxynitride (SiON), and the lower metal layer 276 of the bilayer beam may comprise one of aluminum (Al), Cu, and Au. The lower metal layer 276 may penetrate the upper insulating layer 274 at the first end of the bilayer beam to contact the metallic core of the TSV.

As described in detail, below, the W cones 275 may be formed using a template of graded borophosphosilicate glass (BPSG) that is etched with dilute hydrofluoric (HF) acid. The template may then be filled by selective chemical vapor deposition of tungsten (W) to form the W cones 275.

Referring to FIG. 3, test probe chip 350 may include MEMS switches 370 that use a sandwich beam comprising an upper insulating layer 374, an interposing metal layer 376, and a lower insulating layer 379. The test probe chip 350 may include a second IC layer 352, which contains partial functional circuits of a 3-dimensional IC. Nodes within the second IC layer 352 may contact a first set of TSVs 360 that extend downwardly through a base layer 362 and beyond a lower surface of the base layer 362. The extensions of each of the TSVs 360, beyond the lower surface of the base layer 362, may contact a portion of the interposing metal layer 376 that penetrates the upper insulating layer 374 at a first end of the sandwich beam to provide electrical contact. The W cone 375 may be disposed on a lower surface of the lower insulating layer 379 at a second end of the sandwich beam and may penetrate the lower insulating layer 379 to contact the interposing metal layer 376. Each of the MEMS switches 370 may include an actuator 377 that is disposed on the lower surface of the base layer 362 and above the second end of the sandwich beam. Each of the actuators 377 for each of the MEMS switches 370 may contact nodes within the second IC layer 352 by a second set of TSVs 378.

Each of the TSVs in the first and second sets of TSVs 360, 378, respectively, may comprise a peripheral insulating layer, e.g., silicon dioxide ($SiO_2$), and a metallic conductive core. The base layer 362 may comprise any of an insulator, a semiconductor, and a combination of an insulator and a semiconductor, and the lower surface of the base layer 362 may comprise any of $SiO_2$ and SiCOH with an associated barrier layer of any of SiN and SiCN.

The upper insulating layer 374 and the lower insulating layer 379 of the sandwich beam may each comprise one of $SiO_2$, silicon nitride (SiN), and silicon oxynitride (SiON), and the interposing metal layer 376 of the sandwich beam may comprise one of Al, Cu, and Au. The interposing metal layer 376 may penetrate the upper insulating layer 374 at the first end of the sandwich beam to contact the metallic core of the TSV.

Figure 4:
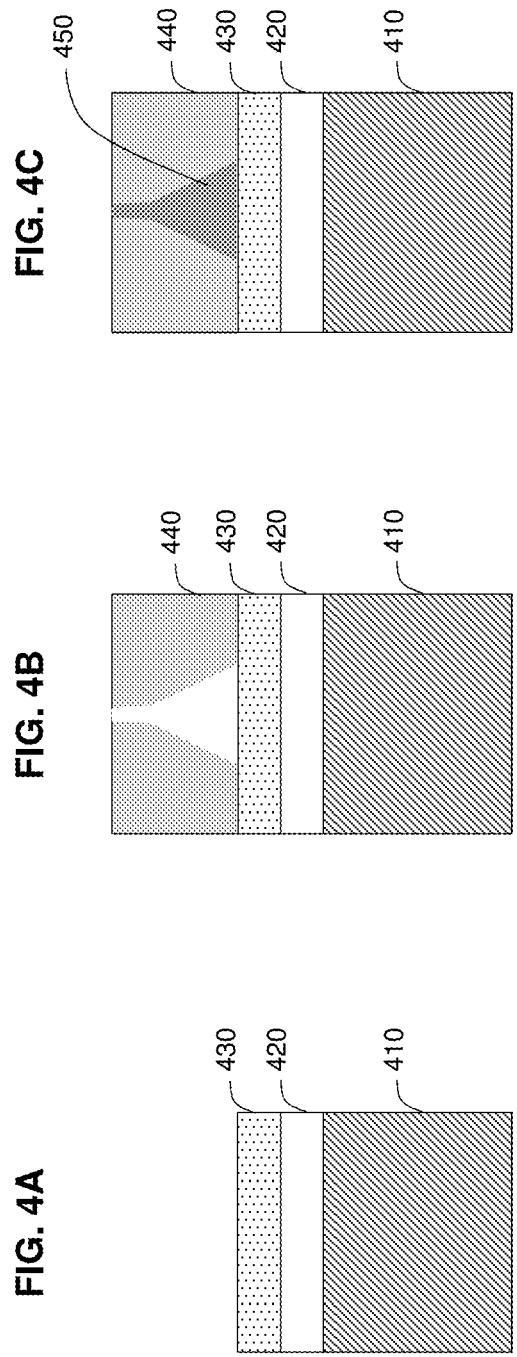
FIG. 4A is a schematic drawing illustrating a substrate for a method of making a tungsten (W) cone contact for a MEMS switch in an exemplary embodiment.
FIG. 4B is a schematic drawing illustrating a conical cavity formed within a graded borophosphosilicate glass (BPSG), which is deposited on the substrate, in the method of making a W cone contact in an exemplary embodiment.
FIG. 4C is a schematic drawing illustrating the W cone contact formed within the conical cavity of the BPSG in the method of making the W cone contact in an exemplary embodiment.

A method of making a W cone contact 175, 272, 375 of FIGS. 1, 2, and 3, respectively, is illustrated in FIGS. 4A-C. The W cone contacts may have a high modulus and hardness, thereby allowing the W cone contacts to break through oxide layers, which form on any of the tin (Sn), lead (Pb), silver (Ag), gold (Au), and their alloys of the metal caps 135 on the TSVs 130 of the chip under test 120, as shown in FIG. 1. Any damage to the metal caps 135 during test may be healed by a heated reflow of the metal caps 135 prior to chip joining, i.e., joining of the chip under test to another chip to complete the functional circuitry of the 3-dimensional IC.

As shown in FIG. 4A, a metal seed layer 430 may be formed on a polyimide layer 420, which is formed on a Si substrate layer 410. The metal seed layer 430 may comprise one of an alloy of Al and W, and Au and W.

As shown in FIG. 4B, a graded borophosphosilicate glass (BPSG) 440 may be deposited on the metal seed layer 430. The gradation of boron (B) and phosphorus (P) concentrations in the BPSG 440 may have their highest concentrations proximate to the top surface of the metal seed layer 430, i.e., the highest concentrations of B and P are at the bottom of the BPSG 440, and their lowest concentration, even zero concentrations, at the top of the BPSG 440. In various embodiments, the total concentration of the B and P doping at its highest concentration may be approximately 10%. A patterned resist (not shown) that forms a hole may be formed on the BPSG 440. A reactive ion etch may form a hole through the BPSG 440 to the top surface of the metal seed layer 430 using the patterned resist. The hole through the BPSG 440 may have a diameter of from 10 to 500 nm in various exemplary embodiments. The patterned resist may then be removed. A wet etch, using dilute hydrogen fluoride (HF), may be introduced into the hole in the BPSG 440. The dilute HF may etch those regions of the graded BPSG 440 with high B and P concentrations at a faster rate than those regions of the graded BPSG 440 with low B and P concentrations. Thus, a conical cavity may be formed within the graded BPSG 440, with a wide base of the conical cavity being formed proximately to the top surface of the metal seed layer 430, where the concentrations of B and P are highest in the graded BPSG 440, and with a narrow tip of the conical cavity being formed distally from the top surface of the metal seed layer 430, where the B and P concentrations are lowest, or even zero, proximate to a top surface of the graded BPSG 440. In various exemplary embodiments, the height of the conical cavity may range from 0.1 μm to 10 μm, the width of the conical cavity at its base may range from 0.1 μm to 10 μm, and the width of the conical cavity at its tip may range from 0.01 μm to 1.0 μm.

As shown in FIG. 4C, tungsten (W) may be selectively deposited by chemical vapor deposition through the hole at the tip of the conical cavity within the graded BPSG 440 to fill the conical cavity formed on the metal seed layer 430. In various exemplary embodiments, the W cone contact 450 formed within the conical cavity may have a height of from 0.1 μm to 10 μm, a base width of from 0.1 μm to 10 μm, and a tip width of from 0.01 μm to 1.0 μm. The graded BPSG 440, surrounding the W cone contact 450 formed in the conical cavity, may be stripped by a wet etch using HF to expose the W cone contact 450. In various exemplary embodiments, the W cone contact 450 may then be removed from the metal seed layer 430 and incorporated in the MEMS switch.

Figure 5:
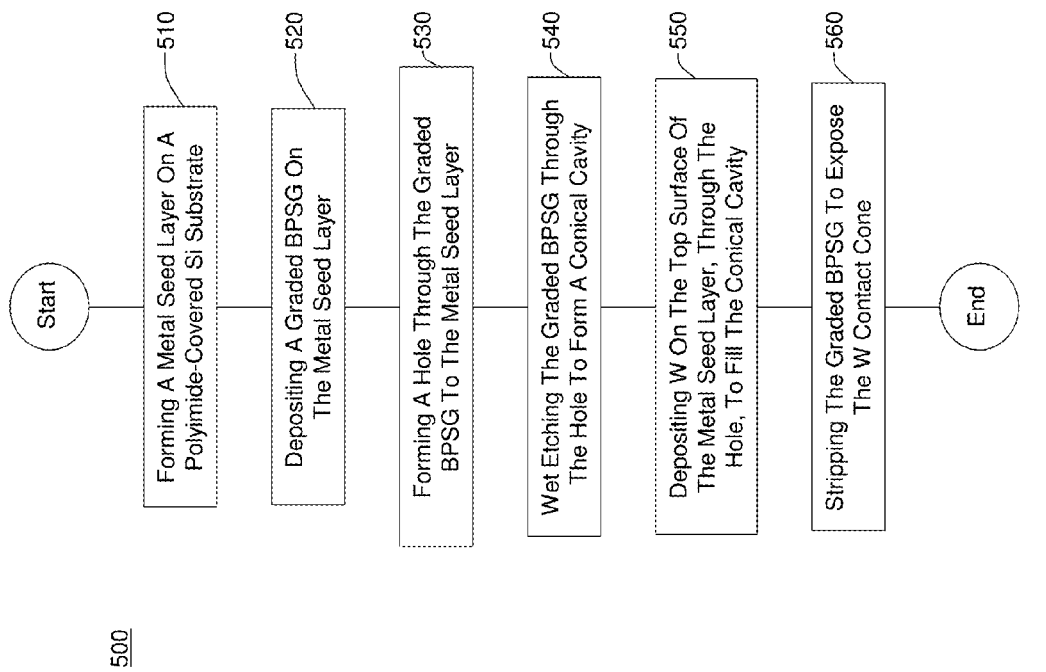
FIG. 5 is a flowchart illustrating a method of making a W cone contact for a MEMS switch used in a test system in an exemplary embodiment.

Referring to the flowchart 500 of FIG. 5, a method of making tungsten (W) cone contact for a MEMS switch used in the test system may comprise forming a metal seed layer on a polyimide-covered silicon (Si) substrate layer, 510. The method may also comprise depositing graded borophosphosilicate glass (BPSG) on the metal seed layer, 520. The method may further comprise forming a hole through the graded BPSG to a top surface of the metal seed layer, 530. The method may yet further comprise wet etching the graded BPSG through the hole to form a conical cavity within the graded BPSG, in which the conical cavity has a base on the top surface of the metal seed layer and a tip at a top surface of the BPSG, 540. The method may yet further comprise depositing tungsten (W) on the top surface of the metal seed layer, through the hole, to fill the conical cavity in the BPSG, 550. The method may finally comprise stripping the graded BPSG to expose the W cone contact, 560.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The description of the embodiments herein has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated.

What is claimed is:

1. A test probe chip, comprising:
an integrated circuit (IC) layer that forms a portion of a 3-dimensional IC, said IC layer being formed above a base layer;
a first through silicon via (TSV), said first TSV contacting said IC layer and extending through said base layer to contact a micro-electrical-mechanical systems (MEMS) switch, said MEMS switch comprising:
a beam having an upper surface of a first end that contacts an extension of said first TSV beneath a lower surface of said base layer,
a tungsten (W) cone contact disposed on a lower surface at a second end of said beam, and
an actuator disposed on said lower surface of said base layer and separated from said upper surface of said second end of said beam by an air gap, when not actuated.

2. The test probe chip of claim 1, each of said TSVs comprising a peripheral insulating layer of silicon dioxide ($SiO_2$) and a metallic core of copper (Cu).

3. The test probe chip of claim 2, said beam comprising a bilayer of an upper insulating layer and a lower metal layer, said lower metal layer penetrating said upper insulating layer at said first end of said beam to contact said metallic core of said single TSV.

4. The test probe chip of claim 3, said beam comprising a sandwich of an upper insulating layer, an interposing metal layer, and a lower insulating layer, said W cone contact penetrating said lower insulating layer to contact said interposing metal layer, and said interposing metal layer penetrating said upper insulating layer at said first end of said beam to contact said metallic core of said single TSV.

5. The test probe chip of claim 1, said W cone contact having a height of from 0.1 μm to 10 μm, a base width of from 0.1 μm to 10 μm, and a tip width of from 0.01 μm to 1.0 μm.

6. The test probe chip of claim 1, further comprising a second TSV that contacts said actuator at a first end and provides a contact to external test equipment at a second end.

7. A test system, comprising:
a chip under test comprising a first integrated circuit (IC) layer that forms a first portion of a 3-dimensional IC, a first base layer disposed above said first IC layer, and a through silicon via (TSV) that contacts said first IC layer and extends above an upper surface of said first base layer, said TSV being capped by a metal cap;
a test probe chip comprising a second IC layer that forms a second portion of said 3-dimensional IC, and a second base layer disposed beneath said second IC layer, said second base layer including a first TSV and a second TSV, said first TSV contacting said second IC layer and extending through said base layer to contact a micro-electrical-mechanical systems (MEMS) switch, said MEMS switches comprising:
a beam, an upper surface of a first end of said beam contacting said first TSV of said test probe chip,
a tungsten (W) cone contact disposed on a lower surface and at a second end of said beam, said W cone contact being aligned above said metal cap of said TSV that contacts said first IC layer of said chip under test, and
an actuator disposed on a lower surface of said test probe chip and above said upper surface at a second end of said beam; and
external test equipment that contacts said actuator of said MEMS switch through said second TSV of said test probe chip.

8. The test system of claim 7, each of said TSVs in said test chip and said test probe chip comprising a peripheral insulating layer of silicon dioxide ($SiO_2$) and a metallic core of copper (Cu).

9. The test system of claim 8, said beam comprising a bilayer beam, said bilayer beam comprising:
   an upper insulating layer comprising one of $SiO_2$, silicon nitride (SiN), and silicon oxynitride (SiON), and
   a lower metal layer comprising one of aluminum (Al), Cu, and gold (Au), said lower metal layer penetrating said upper insulating layer at said first end to contact said metallic core of said first TSV that contacts said second IC layer of said test probe chip.

10. The test system of claim 8, said beam comprising a sandwich beam, said sandwich beam comprising:
    an upper insulating layer comprising one of $SiO_2$, silicon nitride (SiN), and silicon oxynitride (SiON),
    an interposing metal layer comprising one of aluminum (Al), Cu, and gold (Au), said interposing metal layer penetrating said upper insulating layer at said first end to contact said metallic core of said first TSV that contacts said second IC layer of said test probe chip, and
    a lower insulating layer comprising one of $SiO_2$, silicon nitride (SiN), and silicon oxynitride (SiON), said lower insulating layer being penetrated by said interposing metal layer at said second end of said beam to effect contact with said W cone contact.

11. The test system of claim 7, said W cone contact having a height of from 0.1 µm to 10 µm, a base width of from 0.1 µm to 10 µm, and a tip width of from 0.01 µm to 1.0 µm.

12. The test system of claim 7, said external test equipment selectively actuating a subset of MEMS switches in said test probe chip with an actuation voltage that performs one of: breaking and making electrical contact between a corresponding subset of W cone contacts and a corresponding subset of metal caps of a said TSVs that contact said first IC layer of said chip under test.

13. The test system of claim 12, said actuation voltage having a higher range of voltage values that result in a non-conducting air gap between said W cone contact and said metal cap of said TSV that contacts said first IC layer of said chip under test, and a lower range of values that result in electrical contact between said W cone contact and said metal cap of said TSV that contacts said first IC layer of said chip under test.

14. A method of making a tungsten (W) cone contact for a micro-electrical-mechanical system (MEMS) switch used in a test system, said method comprising:
    forming a metal seed layer on a polyimide-covered silicon (Si) substrate layer;
    depositing graded borophosphosilicate glass (BPSG) on said metal seed layer;
    forming a hole through said graded BPSG to a top surface of said metal seed layer;
    wet etching said graded BPSG through said hole to form a conical cavity within said graded BPSG, said conical cavity having a base on said top surface of said metal seed layer and a tip at a top surface of said BPSG;
    depositing tungsten (W) on said top surface of said metal seed layer, through said hole, to fill said conical cavity in said BPSG; and
    stripping said graded BPSG to expose said W cone contact.

15. The method of claim 14, said graded BPSG having a highest concentration of boron (B) and phosphorus (P) proximate to said top surface of said metal seed layer, and a lowest concentration of B and P, including zero concentration, proximate to said top surface of said BPSG.

16. The method of claim 15, said wet etching of said graded BPSG etching more of said graded BPSG with higher concentrations of boron (B) and phosphorus (P), and etching less of said graded BPSG with lower concentrations of B and P to form said conical cavity.

17. The method of claim 14, said forming of said hole comprising reactive ion etching of said hole through a patterned resist.

18. The method of claim 14, said wet etching comprising etching with dilute hydrogen fluoride (HF).

19. The method of claim 14, said depositing of tungsten (W) comprising selective chemical vapor deposition of W.

20. The method of claim 15, said metal seed layer comprising one of: an aluminum (Al)-tungsten (W) alloy, and a gold (Au)-tungsten (W) alloy.

* * * * *